United States Patent [19]
Gervay

[11] 3,879,204
[45] Apr. 22, 1975

[54] TWO-LAYER PHOTOPOLYMERIZABLE GRAVURE RESIST FILM

[75] Inventor: Joseph Edmund Gervay, Red Bank, N.J.

[73] Assignee: E. I. du Pont de Nemours and Company, Wilmington, Del.

[22] Filed: May 9, 1973

[21] Appl. No.: 358,526

Related U.S. Application Data

[63] Continuation-in-part of Ser. No. 112,085, Feb. 2, 1971, abandoned.

[52] U.S. Cl. .......................... 96/83; 96/36; 96/115 P
[51] Int. Cl. .......................... G03c 1/90
[58] Field of Search .......................... 96/83, 115 P, 36

[56] References Cited

UNITED STATES PATENTS

| | | | |
|---|---|---|---|
| 2,976,147 | 3/1961 | Alles | 96/83 |
| 3,043,695 | 7/1962 | Alles | 96/83 |
| 3,418,118 | 12/1968 | Thommes et al. | 96/115 P |
| 3,573,907 | 4/1971 | Verelst et al. | 96/83 |
| 3,718,473 | 2/1973 | Gervay et al. | 96/83 |
| 3,787,213 | 1/1974 | Gervay et al. | 96/36 |

*Primary Examiner*—J. Travis Brown

[57] ABSTRACT

An element suitable for preparing an etching resist layer on an etchable surface comprises a smooth, flexible, removable support, bearing a hydrophilic macromolecular organic colloid layer containing a surfactant and optionally containing antihalation actinic radiation absorbing material, and compounds which comprise a photogenerated imaging system, and, coated on the hydrophilic colloid layer, a layer comprising a continuous phase of a hydrophilic, organic, macromolecular polymer dispersion medium (e.g., gelatin) and a dispersed phase including at least one addition polymerizable ethylenically unsaturated monomer (e.g., an acrylic or methacrylic acid polyester such as trimethylolpropane triacrylate) and a photoinitiator.

13 Claims, No Drawings

TWO-LAYER PHOTOPOLYMERIZABLE GRAVURE RESIST FILM

CROSS REFERENCE TO RELATED APPLICATION

This application is a continuation-in-part application of copending U.S. application Ser. No. 112,085 filed Feb. 2, 1971 by the same inventor, now abandoned. Furthermore, Assignee's Gervay & Walker, U.S. application Ser. No. 864,206 filed Oct. 6, 1969, now abandoned and refiled as U.S. application Ser. No. 219,165 filed Jan. 19, 1972 discloses gravure resist layers having a composition similar to those described herein.

BACKGROUND OF THE INVENTION

1. Field of the Invention

This invention relates to heterogeneous photopolymerizable compositions, layers and elements useful for the formation of gravure images and printed circuit resists and comprising a removable support bearing on its surface a photopolymerizable layer of at least one ethylenically unsaturated monomer dispersed in a hydrophilic binder and an initiator activatable by actinic radiation. More particularly it relates to improved elements incorporating an auxiliary layer.

2. Description of the Prior Art

It is known that photopolymerization can be carried out in such a manner as to reproduce original text and pictorial matter as shown in assignee's Plambeck U.S. Pat. No. 2,760,863. Practical applications of such a process have been used, for example, in the preparation of relief printing plates by wash-out of unpolymerized areas. Thermal transfer of unpolymerized areas as disclosed in assignee's Burg and Cohen U.S. Pat. No. 3,060,025, Oct. 23, 1962 can also be used. In compositions of the prior art, it is customary to employ homogeneous mixtures wherein the polymerizable monomer, the photo-initiator, and the binder are all within a single phase. In such a single phase system it is known that severe inhibition of the polymerization reaction is caused by the presence of oxygen. It has been difficult to reproduce continuous tone images by photopolymerization of homogeneous compositions probably because of the oxygen inhibition effect.

It is also known, of course, to prepare gravure etching resists using a stripping film having a gelatinosilver halide emulsion thereon in the manner taught by assignee's Grumbine, U.S. Pat. No. 2,993,792. This method and element have enjoyed considerable commercial success. However, the process of use involves several steps which include developing and fixing of the exposed silver halide in liquid processing solutions and which require highly skilled technicians to carry out. It further requires washing of the unexposed areas of the resist with hot water to remove said areas from the surface before the conventional ferric chloride etching solution is used.

In Thommes & Walker U.S. Pat. No. 3,418,118, patented Dec. 24, 1968, and in Chang & Walker, U.S. Pat. No. 3,579,399, there are described heterogeneous photopolymerizable compositions which are less subject to the above discussed inhibiting effect of oxygen. Such compositions are coated to form both a monolayer and multilayer elements which contain part of a color image-yielding composition and are useful in forming colored images. It is not evident from these applications that similar compositions could be used to form gravure and printed circuit etching resists of high quality and requiring a minimum number of simple steps to carry out the process.

Assignee's copending application by Gervay & Walker, Ser. No. 864,206, filed Oct. 6, 1969, now abandoned and refiled as U.S. application Ser. No. 219,165 filed Jan. 19, 1972 and the applications referred to therein, and continuation-in-part application Ser. No. 110,319 filed Jan. 27, 1971 entitled "Photopolymerizable Elements Containing Hydrophilic Colloids and Polymerizable Monomers for Making Gravure Printing Plate Resists," discloses elements particularly adapted for preparing gravure etching resists. These elements, while having commercial utility, have certain disadvantages. If antihalation light-absorbing compounds are used they must be incorporated either in the photosensitive layer, with accompanying effect on sensitometry or in a backing layer with some loss in effectiveness. Furthermore, in laying down these elements on the surface to be etched and stripping off the support, special solvents such as alcohol-water mixtures and critical exposure conditions often must be used for optimum results.

Another disadvantage of the elements of Gervay et al. is that while the support is easily stripped from the resist layer before exposure, after exposure, the adhesion of the support to the layer is much greater in the exposed portions of the element. Consequently, it is difficult to strip the support from the resist layer after the element has been adhered to the surface to be etched without damaging the resist layer. The problem is particularly acute when water, the preferred material, is used to wet the surface to which the resist layer is adhered.

SUMMARY OF THE INVENTION

It is an object of this invention to provide improved supported photopolymerizable elements suitable for preparing gravure etching resists. A further object is to prepare such elements which incorporate an auxiliary layer between the support and the photopolymerizable layer.

These objects are accomplished by an element for forming a heterogeneous diffusion resist of substantially uniform thickness, comprising a smooth, flexible, dry strippable support bearing in order a. a hydrophilic macromolecular organic colloid layer containing a surfactant having a coating weight of at least about 1.0 mg./dm.$^2$, and
b. a photopolymerizable diffusion resist layer comprising a hydrophilic macromolecular polymer dispersion medium including a dispersed phase containing
   1. at least one ethylenically unsaturated monomer having a boiling point above 100°C. at normal atmospheric pressure and being capable of forming a high polymer by free-radical initiated, chain-propagating addition polymerization; and
   2. in reactive association with said monomer at least one free-radical photo-initiating system activatable by actinic radiation in an amount constituting from 0.01 to 20.0% by weight of the total solids in said dispersion.

The hydrophilic colloid layer effectively prevents the photopolymerizable layer, after it is polymerized by exposure to actinic radiation, from adhering to the support. Suitable hydrophilic macromolecular organic colloids for use as the hydrophilic colloid layer are gelatin, polyvinyl alcohol, and poly(vinylpyrrolidone). The hydrophilic colloid layer may contain auxiliary compounds which permit it to perform additional functions. Thus, antihalation dyes or pigments may be present, and compounds capable of forming a photogenerated imaging system for producing a visible image may also be included.

The hydrophilic macromolecular organic colloid layer should be essentially free of addition polymerizable constituents.

The invention also pertains to a process which comprises (a) exposing to actinic radiation such an element first through a gravure screen and then to a continuous tone image transparency which gives an image in the resist modulated by photopolymerization, (b) adhering the surface of said element to the surface to be etched which has been moistened with an aqueous solution and peeling off the flexible support, (c) and etching the surface to produce an intaglio printing surface with a conventional etching solution, e.g., ferric chloride. The etched surface can then be washed, e.g., with an aqueous solution, to remove residual etching solution and the photopolymer resist. The process may also be carried out by exposing the element to the gravure screen through a transparent support and to the continuous tone image from the opposite side. The element may also be adhered to the surface to be etched, and, optionally, the support may be stripped, before imagewise exposure to actinic radiation As ethylenically unsaturated compounds for the photopolymerizable layer there may be used the monomers set forth in Plambeck, U.S. Pat. No. 2,760,863, patented Aug. 28, 1956, those set forth in Celeste and Bauer, U.S. Pat. No. 3,261,686, July 19, 1966, those disclosed and claimed in Cohen and Schoenthaler, U.S. Pat. No. 3,380,831, Apr. 30, 1968, the polymerizable polymers disclosed and claimed in Assignee's U.S. Pat. Nos., Schoenthaler 3,418,295 Dec. 24, 1968 and Celeste 3,448,089 June 3, 1969.

Useful free-radical photoinitiators are those disclosed in Plambeck, U.S. Pat. No. 2,760,863, Aug. 28, 1956, Notley, U.S. Pat. No. 2,951,758, Sept. 6, 1960, and any of the photoreducible dyes and reducing agents listed in Oster, U.S. Pat. Nos. 2,850,445; 2,875,047; 3,097,096; and Oster et al. U.S. Pat. Nos. 3,074,794; 3,097,097 and 3,145,104. Depending on the initiating system employed, a single component may be used such as the polynuclear quinones or a polynuclear quinone and another initiator such as Michler's ketone may be used, or a multicompound system such as a photoreducible dye and a free-radical producing agent as described below.

The thickness of the photopolymerizable layer may vary widely depending upon the type of resist desired. It may vary from 0.00005 inch to 0.001 inch or thicker. Preferably the thickness ranges from 0.0002 to 0.0007 inch.

DESCRIPTION OF THE PREFERRED EMBODIMENTS

The support used in preparing the element of this invention is preferably a polyethylene terephthalate web which has been biaxially stretched, heat set, and heat relaxed and has not been treated or subbed on the surface on which the photopolymerizable layer of this invention is coated. However, supports having a surface which has been exposed to electrical discharge after the manner described in Traver, U.S. Pat. No. 3,113,208 or exposed to an air/propane flame after the manner described in Bryan, U.S. Pat. No. 3,145,242 are useful.

Other supports may also be used in practicing this invention, such as hydrophobic organic polymer films, e.g., intralinear polyester, and cellulose ester films, e.g., cellulose acetate. Smooth, nonporous, waterproof paper such as that used for photographic paper base is also suitable as a support.

The hydrophilic organic colloid layer of the elements of this invention preferably are freely permeable to aqueous etchant solutions, e.g., ferric chloride, used in etching gravure images. This permeability may be obtained by providing a suitably thin hydrophilic colloid layer or by incorporating suitable plasticizing agents, e.g., nonionic surfactants, in the hydrophilic colloid layer. A preferred coating weight range for such hydrophilic colloid layers containing the small amount of surfactant required for proper coating is from about 1.0 $mg/dm^2$ to 26 $mg/dm^2$. A relatively thick hydrophilic colloid layer may be used in an element of this invention and may be removed, by washing with water, from the photopolymerized resist layer after it has been adhered to the surface to be etched and the support has been stripped off. Such a layer is a less preferred embodiment, however, since it requires an extra step in the process of use.

In order to effectively prevent adhesion of the exposed resist to the support, the hydrophilic colloid layer must be thick enough to maintain its structure throughout coating of the photoresist layer over it. Such a colloid layer should preferably have a coating weight of at least about 1.0 $mg/dm^2$; however, thicker layers can be used in less preferred embodiments as described above.

A preferred hydrophilic macromolecular organic colloid is gelatin. Other such polymers can be used, however, such as polyvinyl alcohol, poly(vinylpyrrolidone) and the hydrophilic colloids described below.

A suitable surfactant must be incorporated into the colloid coating solution, so that the solution uniformly wets the surface of the support. The proper choice of surfactant will depend somewhat on the particular colloid being coated and on the support. The choice in a particular case will be evident to those skilled in the coating art, but in the case of the preferred support, polyethylene terephthalate, phosphate esters having long chains of ethoxy groups terminated by an alkylphenoxy group, Na or K salts of alkyl sulfates of 8-20 carbon atoms and saponin are satisfactory.

Although the hydrophilic organic colloid does effectively facilitate stripping the support from the resist layer after the resist layer has been adhered to the surface to be etched, the hydrophilic colloid layer may also perform other functions. One or more finely divided antihalation dyes and/or pigments may and incorporated in the layer to provide both antihalation properties and protective filter properties to said layer. A layer containing the finely divided materials absorbs imaging actinic radiation which passes through the photosensitive layer of the element, so that it is not reflected back into the photosensitive layer to degrade the sharpness of the image. Such a layer also prevents stray actinic radiation from reaching the photosensitive layer after the element has been adhered to the surface to be etched and the support has been removed. This property permits a surface with adhered resist to be stored for some time under conditions of normal room illumination without deterioration.

The antihalation and filter compounds used are chosen to absorb radiation which will initiate polymerization of the photopolymerizable layer. For common photoresist layers which are sensitive to ultraviolet radiation dyes such as Luxol Fast Yellow T (C.I. Solvent Yellow 47) and Eastone Yellow 6GN (C.I. Disperse Yellow 5) have been found to work well.

Compounds may also be included in the hydrophilic colloid layer which alone or in combination produce a visible image when subjected to actinic radiation. Such a visible image is useful in identifying exposed samples and in properly registering the resist on the surface to be etched. Any imaging system which has a photospeed comparable to that of the photopolymerizable layer may be used. A particularly preferred image forming system is a combination of a hexaaryl biimidazolyl compound with a leuco dye, especially those combinations disclosed in assignees' copending applications by Gervay and Walker, Ser. No. 864,206, filed Oct. 6, 1970, now abandoned, and refiled as U.S. application Ser. No. 219,165 filed Jan. 19, 1972 and by Cescon et al., U.S. Pat. No. 3,445,234 filed May 20, 1969.

In preparing a preferred photopolymerizable dispersion and layer, an aqueous solution or dispersion of a macromolecular organic polymer, e.g., an aqueous gelatin solution, is stirred under high shear during the addition of a nonaqueous or oil phase comprising a solution of at least one addition polymerizable monomer or polymerizable polymer and a photoinitiator in an organic solvent therefor, e.g., ethyl acetate. In order to obtain good dispersions of photopolymerizable droplets, effective surfactants should be present. The surfactant can be admixed with the aqueous gelatin solution. A single addition polymerizable monomer such as pentaerythritol triacrylate is generally satisfactory although a combination of monomers may be used. Polymerizable polymers having a linear carbon backbone chain with extralinear, terminal, ethylenically unsaturated groups such as those disclosed in Schoenthaler U.S. Pat. Nos. 3,418,295 and Celeste 3,448,089 may also be used. Other agents may be added to the coating composition to control the coating properties and/or the photopolymer reaction mechanism, e.g., crosslinking agents such as N,N'-methylene-bisacrylamide, and diacetone acrylamide, supplemental binders, e.g., polyacrylamide, plasticizers, e.g., glycerol, and a thermal polymerization inhibitor, e.g., p-methoxyphenol, etc. may be used. Ethyl acetate is a practical choice of an organic solvent in making heterogeneous photopolymer systems because it has a low boiling point and can be removed easily before coating the dispersion without recourse to high temperatures that could damage the emulsion. Also it is a good solvent for the oil phase. Ethyl acetate for example can be removed by heating the dispersion to 50°C in a rotary evaporator.

Coatings may also be made without using a low-boiling solvent. In these cases, the oil phase is dissolved in a water-miscible high boiling solvent, for example, 2-methoxyethanol. This latter system works as well as the temporary low-boiling, water-immiscible, solvent system and eliminates the step of removing said low boiling solvent by evaporation before coating the dispersion. The size of the dispersed photopolymerizable droplets ranges from 0.1 to 10 microns with the majority being about 0.5 micron. Uniformity of dispersion is directly related to the length of time and degree of blending agitation. Dyes for control of halation and image coloration may also be added to the system.

The thickness of the dried photopolymerizable layer will be about 0.0004 to 0.0007 inch, but this is not at all critical and can easily be adjusted, depending on the type of resist and the etching characteristics desired. A water-permeable organic colloid, e.g., gelatin, anti-abrasion layer about 0.00001 – 0.0003-inch-thick, containing a surfactant, may be coated onto the photopolymerizable layer.

The process of forming the resist images may be performed in any of the conventional ways of making resist images except that it is unnecessary, as required by the prior art, to remove the unexposed portions of the layer by washing and before etching the substrate, e.g., copper surface with aqueous ferric chloride solutions. A convenient method of exposure is by means of a vacuum printing frame as exemplified by the Flip Top nuArc Plate Maker exposing device using a xenon lamp as the source of radiation and manufactured by the nuArc Co., Inc., Chicago, Ill.

Two exposures can be made on the photosensitive resist layer for conventional gravure. One exposure is through a conventional lateral gravure screen followed by an exposure through a continuous tone transparency either negative or positive. The screen exposure may be to the surface of the photosensitive layer or through the transparent support on which the photosensitive layer is coated provided no nonhalation layer has been coated on the back surface. It has been found, surprisingly, that by exposing through the support, the dots have a more desirable configuration. This is because this method produces a more desirable wall shape during etching.

The screen can have a ratio of line to dot width of 1:1 although this is not at all critical and may be varied. A single exposure is used where the image being exposed through is already a gravure halftone image.

After the exposing steps, where the dispersion has been coated on a film support, the surface of the exposed layer is adhered to the surface which is to be etched imagewise. The surface to be etched is moistened and the exposed layer transferred by rolling the film resist under a rubber roller into contact with the moistened surface, e.g., a copper plate. The surface to be etched must be thoroughly cleaned to remove impurities such as grease and tarnish. In the case of a copper plate, the surface may be cleaned with the following solution.

Glacial acetic acid 50 ml
Sodium chloride 250 grams
Distilled water 950 ml

After cleaning with the above solution, the plate can be scoured by rubbing with moist Vienna Lime, and finally dried. It is important that the surface be nonrepellent to water. After laydown, the transparent film support is removed from the resist layer by lifting a corner and peeling it back and away from the copper plate.

After removal of the film support, an etching solution, e.g., ferric chloride 41°–42° Baume, is applied to the resist surface for approximately 15 to 25 minutes or until the plate is etched to the required depth. The image is etched in direct proportion to the amount of hardening in the resist layer because the ferric chloride diffuses through the gelatin at a rate depending on the degree of hardening of the photosensitive layer. Etching may also be done using more than one etching solution e.g., 44° Be for 44 minutes and then 40° Be for 5 minutes.

After etching is completed, the copper plate is flushed with water to stop the action of the etching solution and to remove the resist layer.

Among the procedures for exposing the photopolymerizable layer are

A. Exposing the layer through a contacting gravure screen and then through a contacting continuous tone image.

B. Exposing the layer through a gravure screen in contact with the support and then through a continuous tone image in contact with the photopolymerizable layer.

C. Exposing the layer through a halftone image.

D. Exposing the layer through a halftone and a continuous tone image.

In place of gelatin as a hydrophilic colloid in the dispersing medium, other natural or synthetic water-permeable organic colloid binding agents can be used. Such agents include water-permeable or water-soluble polyvinyl alcohol and its derivatives, e.g., partially hydrolyzed polyvinyl acetates, polyvinyl ethers, and acetals containing a large number of extralinear $—CH_2.CHOH$ groups; hydrolyzed interpolymers of vinyl acetate and unsaturated addition polymerizable compounds such as maleic anhydride, acrylic and methacrylic acid ethyl esters and styrenes. Suitable colloids of the last mentioned type are disclosed in U.S. Pat. Nos. 2,276,322; 2,276,323; and 2,347,811. The useful polyvinyl acetals include polyvinyl acetaldehyde acetal, polyvinyl butyraldehyde acetal and polyvinyl sodium o-sulfobenzaldehyde acetal. Other useful colloid binding agents include the poly-N-vinyllactams of Bolton, U.S. Pat. No. 2,495,918, the hydrophilic copolymers of N-acrylamido alkyl betaines described in Shacklett, U.S. Pat. No. 2,833,650 and hydrophilic cellulose ethers and esters.

When it is desired to add a binder to the dispersed phase, useful binders are water-insoluble polymers, e.g., methyl methacrylate resins, polyvinyl acetals such as polyvinyl butyral and polyvinyl formal, vinylidene chloride copolymers (e.g., vinylidene chloride/acrylonitrile, vinylidene chloride/methacrylate and vinylidene chloride/vinylacetate copolymer, synthetic rubbers (e.g., butadiene/acrylonitrile copolymers, and chloro-2-butadiene-1,3-polymers), cellulose esters (e.g., cellulose acetate, cellulose acetate succinate and cellulose acetate butyrate), polyvinyl esters (e.g., polyvinyl acetate/acrylate, polyvinyl acetate/methacrylate and polyvinyl acetate/polyvinyl chloride and copolymers (e.g., polyvinyl chloride acetate), polyurethanes, polystyrene, etc. When materials such as the above are incorporated in the dispersed phases they may act as viscosity modifiers. For example, the viscosity of the droplets may be increased to a point near a "threshold" value whereby an additional increase in viscosity through polymerization may effect a very noticeable change in some physical or chemical property.

Other useful polymeric binders for the dispersed phase are disclosed in Schoenthaler U.S. Pat. No. 3,418,295. These unsaturated polymers can be crosslinked or can be grafted to by growing monomer chains, thus producing an increased physical effect, particularly a greater hardening of the dispersed droplet. From 1 to 10% or more by weight of total solids, of a nonpolymerizable plasticizer may be employed in the organic phase of the photopolymerizable dispersion to improve the photographic speed. A preferred plasticizer is the mixed ester of triethylene glycol dicaprylate and dicaprate.

Suitable free-radical initiated, chain-propagating addition polymerizable ethylenically unsaturated compounds include preferably an alkylene or a polyalkylene glycol diacrylate prepared from an alkylene gylcol of 2 to 15 carbons or a polyalkylene ether glycol of 1 to 10 ether linkages, and those disclosed in Martin and Barney, U.S. Pat. No. 2,927,022, issued Mar. 1, 1960, e.g., those having a plurality of addition polymerizable ethylenic linkages, particularly when present as terminal linkages, and especially those wherein at least one and preferably most of such linkages are conjugated with a doubly bonded carbon, including carbon doubly bonded to carbon and to such heteroatoms as nitrogen, oxygen and sulfur. Outstanding are such materials wherein the ethylenically unsaturated groups, especially the vinylidene groups, are conjugated with ester structures. The following specific compounds are further illustrative of this class; unsaturated esters of alcohols, preferably the unsaturated esters of polyols and particularly such esters of the alpha-methylene carboxylic acids, e.g., ethylene diacrylate, diethylene glycol diacrylate, glycerol diacrylate, glycerol triacrylate, ethylene dimethacrylate, 1,3-propanediol dimethacrylate, 1,2,4-butanetriol trimethacrylate, 1,4-cyclohexanediol diacrylate, 1,4-benzenediol dimethacrylate, pentaerythritol tetramethacrylate, 1,3-propanediol diacrylate, 1,5-pentanediol dimethacrylate, and bis-acrylates and methacrylates of polyethylene glycols of molecular weight 200–500, and the like; vinyl esters such as divinyl succinate, divinyl adipate, divinyl phthalate and divinyl terephthalate; styrene and derivatives thereof and unsaturated aldehydes, such as sorbaldehyde (hexadienal). An outstanding class of these preferred addition polymerizable components are the esters of alpha-methylene carboxylic acids and substituted carboxylic acids with polyols and polyamides wherein the molecular chain between the hydroxyls and amino groups is solely carbon or oxygen-interrupted carbon. The preferred monomeric compounds are difunctional, but monofunctional monomers can also be used. In addition, the polymericable, ethylenically unsaturated polymers of Burg, U.S. Pat. No. 3,043,805, Martin, U.S. Pat. No. 2,929,710 and similar materials may be used alone or mixed with other materials.

In addition to the initiating systems described above, the materials capable of absorbing actinic radiation may be a cyanine, carbocyanine, or merocyanine dye. The various cyanine and related dyes have been well known in photography for many years and include such dyes as 3-ethyl-5-(2-ethyl-1-benzoxazylidene-β-methyl ethylidene)-2-thio-2,4 (3,5) oxazoledione (prepared as described in Example 16 of Kendall, U.S. Pat. No. 2,272,163) and dyes of the following formulae:

A

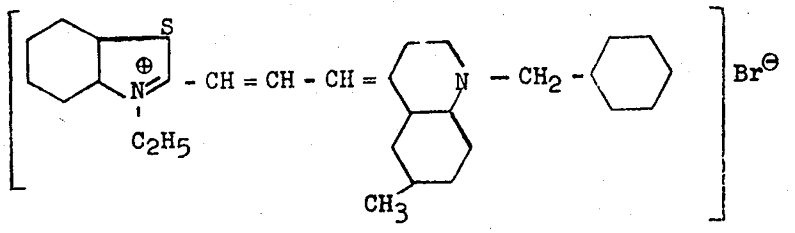

—Continued

B
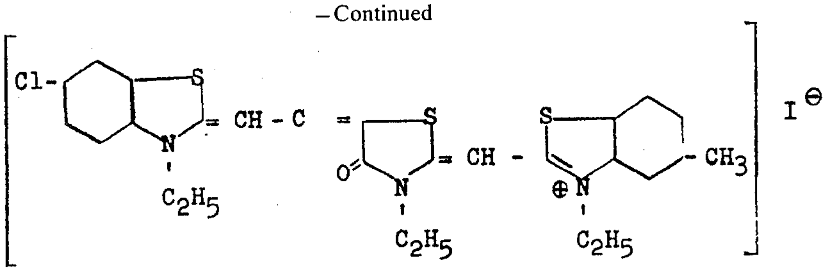

C
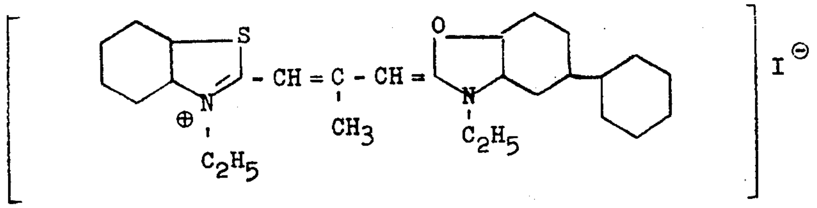

Suitable photoreducible dyes as described above have been disclosed more recently, e.g., in U.S. Pat. Nos. 2,850,445 and 2,875,047.

Also useful are combinations of one or more of the above dyes with quinone type compounds e.g., phenanthrenequinone in combination with the dye prepared according to Example 16 of Kendall, U.S. Pat. No. 2,272,163. Other useful materials for absorbing actinic radiation are the freeradical generating addition polymerization initiators activatable by actinic light and thermally inactive at or below 185°C. These include the substituted or unsubstituted polynuclear quinones which are compounds having two intracyclic carbonyl groups attached to intracyclic carbon atoms in a conjugated carbocyclic ring system. Suitable such initiators include 9,10-anthraquinone, 1-chloroanthraquinone, 2-chloroanthraquinone, 2-methylanthraquinone, 2-ethylanthraquinone, 2-tertbutylanthraquinone, octamethylanthraquinone, 1,4-naphthoquinone, 9,10-phenanthrenequinone, 1,2-benzanthraquinone, 2,3-benzanthraquinone, 2-methyl-1,4-naphthoquinone, 2,3-dichloronaphthoquinone, 1,4-dimethylanthraquinone, 2,3-dimethylanthraquinone, 2-phenylanthraquinone, 2,3-diphenylanthraquinone, sodium salt of anthraquinone alphasulfonic acid, 3-chloro-2-methylanthraquinone, retenequinone, 7,8,9,-10-tetrahydronaphthacenequinone, and 1,2,3,4-tetrahydrobenz(a)anthracene-7,12-dione. Other photoinitiators which are also useful, even though some may be thermally active at temperatures as low as 85°C, are described in Plambeck U.S. Pat. No. 2,760,863 and include vicinal ketaldonyl compounds, such as diacetyl, benzil, etc., α-ketaldonyl alcohols, such as benzoin, pivaloin, etc., acyloin ethers, e.g., benzoin methyl and ethyl ethers, etc., α-hydrocarbon substituted aromatic acyloins, including α-methylbenzoin, α-allylbenzoin, and α-phenylbenzoin.

Other suitable initiators that can be used in the photopolymerizable dispersions and elements of this invention are the lophine dimers (2,4,5-triphenylimidazolyl dimers), consisting of two lophine radicals bound together by a single covalent bond, e.g., 2(o-chlorophenyl)-4,5-diphenylimidazolyl dimer and others, described in Cescon et al. U.S. Pat. No. 3,445,234 and British Specifications Nos. 997,396 and 1,047,569. Suitable free-radical producing electron donor agents for use in such systems, e.g., organic amines, mercaptans triphenylmethane dyes, are set forth in the above-stated U.S. patent and British Specifications. Suitable color amine-substituted leuco dyes which function both as a color forming agent and a free-radical generating agent can be used in the dispersions of this invention. Especially useful leuco dyes have at least one dialkylamino group. Also, any amine substituted leuco triphenylmethane dye or various salts of the dye can be used. Leuco forms of crystal violet which are oxidized upon exposure to form visible images are preferred. Other suitable leuco dyes or their salts are disclosed in Chang et al., U.S. Pat. No. 3,549,367, Dec. 22, 1970.

Since the elements of this invention are for use in a photopolymerizable process, it is obvious that they should be stable against thermally initiated polymerization. Suitable thermal polymerization inhibitors that can be used in photopolymerizable compositions include p-methoxyphenol, hydroquinone, and alkyl and aryl-substituted hydroquinones and quinones, tert-butyl catechol, pyrogallol, copper resinate, naphthylamines, beta-naphthol, cuprous chloride, 2-6-di-tertbutyl p-cresol, phenothiazine, pyridine, nitrobenzene and dinitrobenzene. Other useful inhibitors include p-toluquinone and chloranil and thiazine dyes, e.g., Thionine Blue G (C.I. Basic Blue 25), Methylene Blue B (C.I. Basic Blue 9) and Toluidine Blue 0 ) C.I. Basic Blue 17). In the particularly preferred embodiments containing certain dye or quinone-type photoinitiators, however, no thermal inhibitor is required since these initiators have a dual function and, in the dark, serve as thermal inhibitors.

Since free-radical generating addition-polymerization initiators activatable by actinic radiation generally exhibit their maximum sensitivity in the ultraviolet range, the radiation source should usually furnish an effective amount of this radiation. Such sources include carbon arcs, mercury-vapor arcs, fluorescent lamps with ultraviolet radiation-emitting phosphors, argon glow lamps, electronic flash units and photographic flood lamps.

The image, formed by exposure of a heterogeneous system of this invention, depends upon the differential polymerization of the individual droplets in the dispersed phase. Such differences may make the image visible without further treatment, e.g., it is often possible to see a visible relief image.

Although not essential, it is preferred that a surfactant be employed in dispersing the droplets. Such surfactants are alkylnaphthalene sulfonic acid Na and K salts, organic esters of phosphoric acid, benzyl alcohol, octyl alcohol, lauryl alcohol, sodium lauryl sulphate, sulphonated derivatives of fatty acid amides, the condensation products of octylphenol and sorbitan monolaurate with polyethylene oxide, etc.

Additional low boiling solvents which are water immiscible include esters (e.g., ethyl formate, propyl acetate, n-butyl acetate, ethyl butyrate), hydrocarbons (e.g., benzene), chlorinated hydrocarbons (e.g., chloroform, methylene chloride) and ethers (e.g., diethyl ether).

The following examples will illustrate the practice of this invention but are not intended to limit its scope.

EXAMPLE I

A gelatin solution was prepared as follows.

Eighteen grams of gelatin were added to 725 ml of cold water and allowed to swell. The solution was heated to 95°F., 0.5 g of nonylphenoxy polyethoxy phosphate surfactant was added and the solution was mixed for 3 minutes in a high speed blender. The gelatin solution was skim coated on a 0.007–inch-thick unsubbed polyethylene terephthalate web provided with an antihalation backing layer at a temperature of 95°F. and a speed of 25 ft./min. and dried with warm air to give a gelatin layer approximately 0.0001-inch-thick.

A photopolymerizable dispersion was prepared by the following procedure:

| | |
|---|---|
| Solution A | |
| Gelatin | 18 g |
| Water | 250 ml |
| Solution B | |
| Water | 75 ml |
| Nonylphenoxy polyethoxy phosphate | 0.5 g |
| 10% solution of saponin in alcohol-water | 3 ml |
| Dalamar Yellow (C.I. Pigment Yellow 74) (22% aqueous dispersion with 6% nonylphenoxypoly(ethoxy) ethanol) | 1 g |
| Solution C | |
| Methylene Chloride | 25 ml |
| 2-(o-chlorophenyl)-4,5-diphenyl imidazolyl dimer | 3 g |
| Tris(4-diethylamino-o-tolyl)methane | 1.5 g |
| Leuco Crystal Violet | 0.3 g |
| Trimethylolpropane triacrylate | 12 g |
| Mixture of octanoic and decanoic esters of triethylene glycol | 2 g |
| Polyvinyl pyrrolidone(avg.M.W. 40,000) (25% solution in methylene chloride) | 0.75 g |

Solution A was warmed to 95°F and placed in a high speed blender, Solutions B and C were added in sequence and the mixture was blended for about 2 minutes then rewarmed to 95°F. The mixture was skim coated over the gelatin layer at a temperature of 95°F. and a speed of 25 ft./min., chilled, and dried with warm air to give a coating about 0.0004 inch thick.

A sample of the element so prepared was exposed through a gravure screen to a source of ultra-violet radiation (Addalux mercury vapor lamp Model No. 1412–01) at a distance of 26 inches for 2 minutes. The exposed sample was applied to a copper plate which had been wetted with water by passing the laminate through cold rubber nip rolls at a pressure of 30 lbs. per lineal inch and a speed of 6 ft. per min. The support was then stripped off leaving the resist on the copper surface. The copper with applied resist was etched in 42° Be aqueous ferric chloride solution for 20 minutes. The resist was removed from the copper by washing with hot water. An intaglio pattern of the gravure screen was etched into the surface of the copper plate.

EXAMPLE II

A coating solution was prepared as in Example I except that 3 grams of a 25% by weight solution of polyvinylpyrrolidone (avg. M.W. 40,000) in methylene chloride was added to the gelatin solution while it was being stirred in the high speed blender. An element was prepared as in Example I using this solution in place of the underlayer coating solution of that Example. The element was exposed as in Example I, and a copper plate was etched according to the procedure of Example I using the element of this Example. An intaglio pattern of the gravure screen was etched into the surface of the copper plate.

EXAMPLE III

Example II was repeated except that an antiabrasion layer of the same composition as the underlayer was applied over the photosensitive layer by skim coating at a temperature of 95°F. and a speed of 25 ft./min. and warm air drying. The element was exposed and used as in Example II. An intaglio pattern of the gravure screen was etched into the surface of the copper plate.

EXAMPLE IV

| | |
|---|---|
| Solution A | |
| Luxol Fast Yellow T (C.I. Solvent Yellow 47) | 2 g |
| Oil Yellow 3G (C.I. 21230) | 2 g |
| Ethanol | 60 ml |
| Solution B | |
| Gelatin | 18 g |
| Water | 300 ml |
| Solution C | |
| Water | 100 ml |
| Nonylphenoxy polyethoxy phosphate | 0.2 g |
| Solution D | |
| Mixture of octanoic and decanoic esters of triethylene glycol | 3 g |
| Poly(vinylpyrrolidone)(Avg. 40,000) (25% solution in methylene chloride) | 3 g |
| Methylene Chloride | 25 ml |

Solutions A, B, C, and D were blended for 30 minutes in a high speed attrition mill (Kady Model LB, manufactured by Kinetic Dispersion, Corp., Buffalo, N.Y.). The resulting emulsion was skim coated on a 0.007 inch unsubbed polyethylene terephthalate web at a speed of 10 ft./min., chilled and dried in warm air to give a coating thickness of about 0.00015 inch.

A heterogeneous photopolymerizable emulsion similar to that of Example I was prepared having the following composition.

| | |
|---|---|
| Aqueous phase: | |
| Gelatin | 18 g |
| Sodium salt of technical octyl alcohol sulfate | 3 ml |
| 10% solution of saponin in alcohol-water | 3 ml |
| Nonylphenoxy polyethoxy phosphate | .5 g |
| Water | 325 ml |
| Organic phase: | |
| Methylene chloride | 25 ml |
| Trimethylolpropane triacrylate | 12 g |
| Mixture of octanoic and decanoic esters of triethylene glycol | 2 g |
| 2-(o-chloro)-4,5-diphenyl-imidazolyl dimer | 3.0 g |
| Tris(4-diethylamino-o-tolyl) methane | 1.5 g |
| Leuco Crystal Violet | 0.3 g |
| Luxol Fast Yellow T (C.I. Solvent Yellow 47) | 50 mg |
| Oil Yellow 3G (C.I. 21230) | 50 mg |
| Poly(vinylpyrrolidone)(Avg. M.W. 40,000) (25% solution in methylene chloride) | 3 g |

The photosensitive layer was prepared and coated as in Example I. A sample of the element so prepared was exposed through a conventional gravure screen to the source of Example I for 1 minute and then through a $\sqrt{2}$ step wedge for 10 seconds to the same radiation source. The exposed resist was laid down on a copper plate as in Example I, the support was stripped off and the plate was etched in 43° Be ferric chloride at 72°F. for 30 minutes. The resist was removed by washing with hot water. A gravure image of the wedge reproducing steps between Optical Density 0.3 and 1.6 was produced on the surface of the copper plate.

Another sample was treated in the same way except that after the resist was laid down on the copper and before the assembly was placed in the etchant, it was exposed for 9 hours to a 40-watt white light fluorescent desk lamp at a distance of 2 feet. After etching, no difference was observed between this sample and the one which had not been post-exposed to white light.

EXAMPLE V

Three solutions were prepared.

| | |
|---|---|
| Solution A | |
| Gelatin | 18 g |
| Water | 375 ml |
| Solution B | |
| Water | 75 ml |
| Nonylphenoxy polyethoxy phosphate | 0.5 g |
| Dalamar Yellow (C.I. Pigment Yellow 74) (22% aqueous dispersion with 6% nonylphenoxy poly(ethoxy)ethanol) | 3 g |
| Solution C | |
| Mixture of octanoic and decanoic esters of triethylene glycol | 3 g |
| 2-(o-chloro)-4,5-diphenyl imidazolyl dimer | 1.2 g |
| Leuco Crystal Violet | 1 g |
| Poly(vinylpyrrolidone)(Avg. M.W. 40,000) (25% by weight solution in methylene chloride) | 4 g |
| Methylene chloride | 25 ml |

Solutions A, B, and C were blended in high speed blender for 2 minutes and the dispersion was skim coated at a temperature of 95°F. on a 0.007 inch unsubbed polyethylene terephthalate web at a coating speed of 15 ft./min., chilled, and air dried.

A photopolymerizable resist layer was prepared as follows:

| | |
|---|---|
| Solution D | |
| Gelatin | 18 g |
| Water | 250 ml |
| Solution E | |
| Water | 75 ml |
| Nonylphenoxypolyethoxy phosphate | 0.5 g |
| Dalamar Yellow (C.I. Pigment Yellow 74) (22% aqueous dispersion with 6% nonylphenoxypoly(ethoxy)ethanol) | 1.0 g |
| Solution F | |
| 2-(o-chlorophenyl)-4,5-bis(m-methoxyphenyl)imidazolyl dimer | 1.5 g |
| 2-(o-chlorophenyl)-4,5-diphenyl-imidazolyl dimer | 1.5 g |
| Tris(4-diethylamino-o-tolyl)methane | 1.5 g |
| Hydroquinone | 5 mg |
| Trimethylopropane triacrylate | 12 g |
| Mixture of octanoic and decanoic esters of triethylene glycol | 3 g |
| Poly(vinylpyrrolidone)(Avg. M.W. 40,000) (25% by weight solution in methylene chloride) | 3 g |
| Methylene chloride | 25 ml |

The three solutions were blended in a high speed blender for 2 minutes, and coated over the photoadhesion control layer at a temperature of 95°F. and coating speed of 15 ft./min., chilled and warm air dried.

A sample of the element was exposed through a conventional gravure screen with the source of Example I at a distance of 5 feet for 2 minutes and through a $\sqrt{2}$ step wedge for 1 minute. The sample was used as in Example IV to etch a copper plate except that etching was for 26 min. A gravure image showing 9 steps (Optical Density 0.3 to 1.65) was obtained on the surface of the copper plate.

EXAMPLE VI

Three solutions were prepared.

| | |
|---|---|
| Solution A | |
| Gelatin | 18 g |
| Water | 300 ml |
| Solution B | |
| Water | 100 ml |
| Nonylphenoxy polyethoxy phosphate | 0.5 g |
| Solution C | |
| 2-(o-chlorophenyl)-4,5-bis(m-methoxyphenyl)imidazolyl dimer | 1.5 g |
| Leuco Crystal Violet | 1.0 g |
| Eastone Yellow 6GN (C.I. Disperse Yellow 5) | 3 g |
| Mixture of octanoic and decanoic esters of triethylene glycol | 5 g |
| Poly(vinylpyrrolidone)(Avg. M.W. 40,000) (25% by weight solution in methylene chloride) | 4 g |
| Methylene Chloride | 25 ml |

The three solutions were blended together as in Example V and coated as in Example V at 25 ft./min. The photosensitive layer coating solution of Example V was coated over the hydrophilic colloid layer as in that Example. A sample of the element so prepared was exposed through a conventional gravure screen with the source of Example I at a distance of 5 feet for 3 minutes, and through a $\sqrt{2}$ step wedge for 1 minute. The sample was used to etch a copper plate as in Example IV except that etching was with 43.9° Be ferric chloride for 42 minutes. Ten steps of the $\sqrt{2}$ step wedge were reproduced as a gravure image on the copper plate.

EXAMPLE VII

Three solutions were prepared.

| | |
|---|---|
| Solution A | |
| Gelatin | 18 g |
| Polyacrylamide (M.W. 5-6,000,000) | 0.5 g |
| Water | 375 ml |
| Solution B | |
| Water | 75 ml |
| Nonylphenoxypolyethoxy phosphate | 0.5 g |
| Dalamar Yellow (C.I. Pigment Yellow 74) (22% aqueous dispersion with 6% nonylphenoxy poly(ethoxy)ethanol) | 1.0 g |
| Solution C | |
| Mixture of octanoic and decanoic esters of triethylene glycol | 5.0 g |
| 2-(o-chlorophenyl)-4,5-diphenyl-imidazolyl dimer | 1.0 g |
| Leuco Crystal Violet | 0.5 g |
| Methylene chloride | 25 ml |

The solutions were blended together for 2 minutes in a high speed blender and skim coated at a temperature of 95°F. and a speed of 15 ft./min. on an unsubbed polyethylene terephthalate web, chilled, and warm air dried.

These solutions were prepared.

| | |
|---|---|
| Solution D | |
| Gelatin | 10 g |
| Water | 250 ml |
| Solution E | |
| Water | 75 ml |
| Nonylphenoxypolyethoxy phosphate | 0.5 g |
| Dalamar Yellow (C.I. Pigment Yellow 74) (22% aqueous dispersion with 6% | 1.0 g |

-Continued

| | |
|---|---|
| nonylphenoxypoly(ethoxy)ethanol | |
| Solution F | |
| 2-(o-chlorophenyl)-4,5-bis(m-methoxy-phenyl)imidazolyl dimer | 1.5 g |
| 2-(o-chlorophenyl)-4,5-diphenyl imidazolyl dimer | 1.5 g |
| Tris(4-diethylamino-O-tolyl)methane | 1.5 g |
| Hydroquinone | 5 mg |
| Trimethylopropane triacrylate | 15 g |
| Methylene chloride | 25 ml |
| Polyvinyl pyrrolidone(Avg. M.W. 40,000) (25% solution in methylene chloride) | 3 g |

Solutions D, E and F were blended together in a high speed blender for 2 minutes, skim coated at a temperature of 95°F. and a speed of 25 ft./min. over the previously coated gelatin layer, chilled, and dried in warm air.

A sample of the element was exposed through a conventional gravure screen with the source of Example I at a distance of 5 feet for 3 minutes and then through a $\sqrt{2}$ step wedge for 1.5 minutes.

The sample was used to etch a copper plate as in Example IV except that etching was carried out using 43.5° Baume ferric chloride solution for 44 minutes and 38° Be for 16 minutes. A gravure image of the wedge was obtained on the surface of the copper plate.

EXAMPLE VIII

Three solutions were prepared.

| | |
|---|---|
| Solution A | |
| Gelatin | 18 g |
| Water | 300 ml |
| Solution B | |
| Water | 100 ml |
| Nonylphenoxypolyethoxy phosphate | 0.5 g |
| Sodium salt of technical octyl alcohol sulfate | 3.0 ml |
| 10% solution of saponin in alcohol-water | 3.0 ml |
| Solution C | |
| 2-(o-chlorophenyl)-4,5-bis(m-methoxyphenyl)imidazolyl dimer | 1.5 g |
| Leuco Crystal Violet | 1.0 g |
| Mixture of octanoic and dicanoic esters of triethylene glycol | 5.0 g |
| Methylene chloride | 25 ml |
| Eastone Yellow 6GN (C.I. Disperse Yellow 5) | 3.0 g |
| Poly(vinylpyrrolidone)(Avg. M.W. 40,000) (25% solution in methylene chloride) | |

Solutions A, B, and C were blended together in a high speed blender for 2 minutes, skim coated at a temperature of 95°F. and a speed of 15 ft./min. on an unsubbed polyethylene terephthalate web, chilled, and dried in warm air.

Three solutions were prepared.

| | |
|---|---|
| Solution A | |
| Gelatin | 18 g |
| Water | 300 ml |
| Solution B | |
| Water | 100 ml |
| Nonylphenoxyxpolyethoxy phosphate | 0.5 g |
| Dalamar Yellow (C.I. Pigment Yellow 74) (22% aqueous dispersion with 6% nonylphenoxypoly(ethoxy)ethanol) | 1.0 g |
| Sodium salt of technical octyl alcohol sulfate | 3.0 ml |
| 10% solution of saponin in alcohol-water | 3.0 |
| 2-(o-chlorophenyl)-4,5-diphenyl | 1.5g |
| Solution C | |

-Continued

| | |
|---|---|
| 2-(o-chlorophenyl)-4,5-bis(m-methoxy-phenyl)imidazolyl dimer | 1.5 g |
| 2-(o-chlorophenyl)-4,5-bis(m-methoxy-imidazolyl dimer | |
| Tris(4-diethylamino-O-tolyl)methane | 1.5 g |
| Trimethylolpropane triacrylate | 12 g |
| Mixture of octanoic and decanoic esters of triethylene glycol | 2.0 g |
| Methylene chloride | 25 ml |
| Poly(vinylpyrrolidone)(Avg. M.W. 40,000) (25% solution in methylene chloride) | 3.0 g |

Solutions D, E, and F were blended together in a high speed blender for 2 minutes, skim coated at a temperature of 95°F. and a speed of 15 ft./min. over the coated and dried underlayer, chilled and dried.

A sample of the element was exposed as in Example VII except that the exposure through the wedge was for 2 minutes. The sample was laid down on a copper plate as in Example I, half of the image was covered with an opaque shield and the assembly was exposed to a 40 watt fluorescent desk lamp at a distance of about 2 feet for 1 hour. The opaque screen was removed and the resist-coated copper plate was etched in 44° Be ferric chloride for 40 minutes. A gravure image of six steps of the wedge was produced on the surface of the copper plate. There was no difference between those portions of the image which had been covered with the opaque screen during the post exposure and those which had not.

EXAMPLE IX

A 1% solution of polyvinyl alcohol (high molecular weight) (Elvanol 50-42, manufactured by E. I. du Pont de Nemours & CO., Inc., Wilmington Delaware) was prepared and skim coated at room temperature at a speed of 30 ft./min. on an unsubbed 0.007 inch-thick polyethylene terephthalate web, having an antihalation layer coated on the reverse side and dried in warm air at about 50°C. The dry thickness of the polyvinyl alcohol layer was 0.00005 to 0.00007 inches.

A photopolymerizable gravure resist emulsion similar to that of Example VIII was skim coated at 95°F. at a speed of 30 ft./min. over the polyvinyl alcohol layer, chilled, and dried in warm air at 50°C. The coating was 0.0003 inches thick.

A sample of the element so prepared was exposed through a conventional gravure screen with a carbon art operated at 220 volts and 15 amperes at a distance of 18 inches (nuArc Flip-Top Plate Maker FT 26-M) for 60 seconds. The exposed sample was laminated to a copper plate moistened with water and the assembly was passed through a pair of rubber pinch rolls at a pressure of 30 lbs./linear foot and a speed of 6 ft./min. The support was stripped off and the resist covered copper plate was etched in 43.5° Be aqueous ferric chloride solution at 73°F. for 23.5 minutes. An intaglio image of the gravure screen was produced on the surface of the copper plate.

EXAMPLE X

Two solutions were prepared.

| | |
|---|---|
| Solution A | |
| 5% aqueous solution of polyvinyl alcohol (high molecular weight) | 4000 ml |
| Dalamar Yellow (C.I. Pigment Yellow 74) (22% aqueous dispersion with 6% nonylphenoxypoly(ethoxy)ethanol) | 100 g |

EXAMPLE X-Continued

| Two solutions were prepared. | |
|---|---|
| Solution B | |
| Methylene chloride | 100 ml |
| 2,2'-dihydroxy-4-methoxybenzophenone | 40 g |
| Mixture of octanoic and decanoic esters of triethylene glycol | 70 g |

Solutions A and B were milled in a high shear mill for 15 minutes. Ninety milliliters of a 10% solution of saponin in alcohol-water were added.

The resulting dispersion was skim coated at room temperature at a speed of 60 ft./min. using an air knife doctor at a pressure of 1.5 in. of water on an unsubbed polyethylene terephthalate web and dried by blowing warm air at a temperature of 225°F. over the web. The thickness of the dried coating was about 0.00020 to 0.00025 inches.

A photopolymerizable gravure resist dispersion similar to that of Example VIII was coated over the polyvinyl alcohol layer as in Example IX. The thickness of the layer was about 0.00020 to 0.00025 inches.

A sample of the element so prepared was exposed, laminated and etched as in Example IX. An intaglio image of the gravure resist screen was produced on the surface of the copper plate.

EXAMPLE XI

| Two solutions were prepared according to the following procedure: | |
|---|---|
| Solution A | |
| Gelatin | 72 g |
| Water | 2736 ml |

The gelatin was soaked in the water for 0.5 hour then digested at 125°F. for 0.5 hour.

| Solution B | |
|---|---|
| 10% solution of nonylphenoxy-polyethoxy phosphate | 36 ml |
| 10% solution of saponin in ethanol-water | 36 ml |

Solution A was cooled to 90°F. and Solution B was added. Solutions of different concentrations were prepared by diluting with water. The resulting solutions were skim coated at 90°F. at a speed of 30 ft./min. on an unsubbed 0.007 inch-thick polyethylene terephthalate web having an antihalation and antistatic coating on the reverse side to prepare several coatings having gelatin layers of different thicknesses. Each of the coatings so prepared was coated with a heterogeneous photopolymerizable layer suitable for preparing a gravure resist similar to that of Example VIII. Samples of each of the elements so prepared were exposed through a 2.5/1 ratio 150 lines/inch gravure screen with the light source of Example I at a distance of 26 inches for 45 seconds. The exposed samples were then laid down on a water moistened copper surface by the procedure of Example I and etched in Flowing 42.1° Be aqueous ferric chloride solution at a temperature of 73°F. Results are summarized in Table I.

TABLE I

| Coating Solution % Solids | Coating Weight ($mg/dm^2$) | Thickness (inches) | Laydown and Strip | Etched Image |
|---|---|---|---|---|
| 5 | 76 | 0.00025 | Satisfactory | Yes |
| 2.5 | 26 | 0.00010 | do. | do. |
| 1.25 | — | — | do. | do. |
| 0.625 | 5.1 | — | do. | do. |
| 0.14 | 1.7 | — | do. | do. |
| 0.14 (10 ft./min. coating speed | 1.2 | — | do. | do. |

EXAMPLE XII

The hydrophilic colloid layer coating solution of Example XI was coated at a solids content of 0.625 per cent under the coating conditions of Example XI on unsubbed 0.0055 inch-thick cellulose triacetate photographic film base to give a coating weight of 5.7 $mg/dm^2$. A photopolymerizable gravure resist layer coated over the photoadhesion control layer as in Example XI. A sample of the element so prepared was exposed as in Example XI except the exposure was for 20 seconds and was used as in Example XI to etch the surface of a copper plate. A gravure image was produced on the surface of the copper plate.

EXAMPLE XIII

Example XII was repeated using unsubbed, untreated polyethylene coated photographic paper base as the support and the hydrophilic colloid layer was coated to a coating weight of 8.6 $mg/dm^2$. A gravure image was obtained on the surface of a copper plate etched by use of this element.

EXAMPLE XIV

A 1% aqueous solution of poly(vinylpyrrolidone) (M.W. 40,000) containing 0.1% of nonylphenoxy polyethoxy phosphate and 0.1% of saponin was prepared. The solution was coated as in Example XI on unsubbed 0.007 inch thick polyethylene terephthalate support to give a coating weight of 37 $mg/dm^2$. A gravure resist layer was coated over the hydrophilic colloid layer as in Example XI. A sample of this element was exposed and tested as in Example XI. A gravure image was produced on the surface of the copper plate.

EXAMPLE XV

A 2.5% aqueous gelatin solution containing 0.045% monooleyl ether of decaethylene glycol was prepared. The solution was coated as in Example XI to give a coating weight of 30 $mg/dm^2$. A gravure resist layer was coated as in Example XI over the hydrophilic colloid layer. A sample of the element so prepared was exposed and tested as in Example XI. A gravure image was obtained on the surface of the copper plate.

EXAMPLE XVI

Example XV was repeated except that 0.075% saponin was used in place of the monooleyl ether of decaethylene glycol. A sample of this element was exposed and tested as in Example XI. A gravure image was obtained on the surface of the copper plate.

The metal plates containing the gravure images of each of the above-listed examples were of high quality and suitable for printing with conventional gravure printing inks.

What is claimed is:

1. An element for forming a heterogeneous diffusion etched resist of substantially uniform thickness comprising a smooth, flexible, dry strippable support bearing, in order, a. a hydrophilic macromolecular organic colloid layer containing a surfactant, and having a coating weight of at least about 1.0 mg./dm.$^2$, and b. a photopolymerizable diffusion resist layer comprising a hydrophilic macromolecular polymer dispersion medium including a dispersed phase containing 1. at least one ethylenically unsaturated monomer having a boiling point above 100°C. at normal atmospheric pressure and being capable of forming a high polymer by free-radical initiated, chain-propagating addition polymerization; and 2. in reactive association with said monomer, at least one free-radical photoinitiating system activatable by actinic radiation in an amount constituting from 0.01 to 20.0% by weight of the total solids in said dispersion.

2. An element according to claim 1, wherein the support is a hydrophobic organic polymer film.

3. An element according to claim 1, wherein said support is a hydrophobic organic polymer film transparent to actinic radiation.

4. An element according to claim 1, wherein the support is a biaxially-oriented polyethylene terephthalate film.

5. An element according to claim 1, wherein the hydrophilic colloid layer has a coating weight of 1.0 mg/dm$^2$ to 26 mg/dm$^2$.

6. An element according to claim 1, wherein the hydrophilic colloid layer has a coating weight of 1.0 mg/dm$^2$ to 26 mg/dm$^2$ and contains a finely divided antihalation dye or pigment.

7. An element according to claim 1, wherein the hydrophilic colloid layer has a coating weight of 1.0 mg/dm$^2$ to 26 mg/dm$^2$ and the photopolymerizable layer has a thickness of 0.00005 – 0.001 inch.

8. An element according to claim 1, wherein layer (b) bears (c) a water-permeable organic colloid antiabrasion layer.

9. An element according to claim 1, wherein said unsaturated monomer is trimethylolpropane triacrylate.

10. An element according to claim 1, wherein the organic colloid layer comprises gelatin.

11. An element according to claim 1, wherein the organic colloid layer comprises gelatin, a leuco dye, and a 2,4,5-triarylimidazolyl dimer consisting of two lophine radicals bound together by a single covalent bond.

12. An element according to claim 1, wherein the organic colloid layer comprises gelatin and poly(vinylpyrrolidone).

13. An element according to claim 1, wherein the dispersed phase contains a 2,4,5-triarylimidazolyl dimer consisting of two lophine radicals bound together by a single covalent bond.

* * * * *